United States Patent [19]

Isshiki

[11] Patent Number: 4,768,200
[45] Date of Patent: Aug. 30, 1988

[54] INTERNAL CURRENT CONFINEMENT TYPE SEMICONDUCTOR LIGHT EMISSION DEVICE

[75] Inventor: Kunihiko Isshiki, Itami, Japan

[73] Assignee: Mitsubishi Denki Kabushiki Kaisha, Tokyo, Japan

[21] Appl. No.: 875,321

[22] Filed: Jun. 17, 1986

[30] Foreign Application Priority Data

Jun. 18, 1985 [JP] Japan ................................. 60-132711

[51] Int. Cl.$^4$ ............................................... H01S 3/19
[52] U.S. Cl. ........................................ 372/46; 357/17; 372/48
[58] Field of Search ................. 372/45, 46, 48; 357/17

[56] References Cited

U.S. PATENT DOCUMENTS

| | | | |
|---|---|---|---|
| 4,545,057 | 10/1985 | Hayakawa et al. | 372/45 |
| 4,606,033 | 8/1986 | Sakamoto | 372/46 |
| 4,679,200 | 7/1987 | Matsui et al. | 372/46 |

FOREIGN PATENT DOCUMENTS 57-172789 10/1982 Japan .

Primary Examiner—James W. Davie
Attorney, Agent, or Firm—Birch, Stewart, Kolasch & Birch

[57] ABSTRACT

A semiconductor light emission device includes: a first conductivity type semiconductor substrate which has a pair of confronting resonator end surfaces and a hollow section provided thereon. The hollow section is arranged in a direction vertical the direction in which the resonator end surfaces confront each other. A second conductivity type current blocking layer having a flat upper surface is provided on the entire upper surface of the semiconductor substrate. A stripe groove is provided in the current blocking layer extending in a direction between the resonator end surfaces in such a manner that the groove reaches only within the current blocking layer at the hollow section and reaches the semiconductor substrate through the current blocking layer at portions outside the hollow section. A first conductivity type lower clad layer is provided on the entire upper surface of the current blocking layer so as to embed the stripe groove. A first or second conductivity type active layer is provided on the entire upper surface of the lower clad layer, and a second conductivity type upper clad layer is provided on the entire upper surface of the active layer.

12 Claims, 5 Drawing Sheets

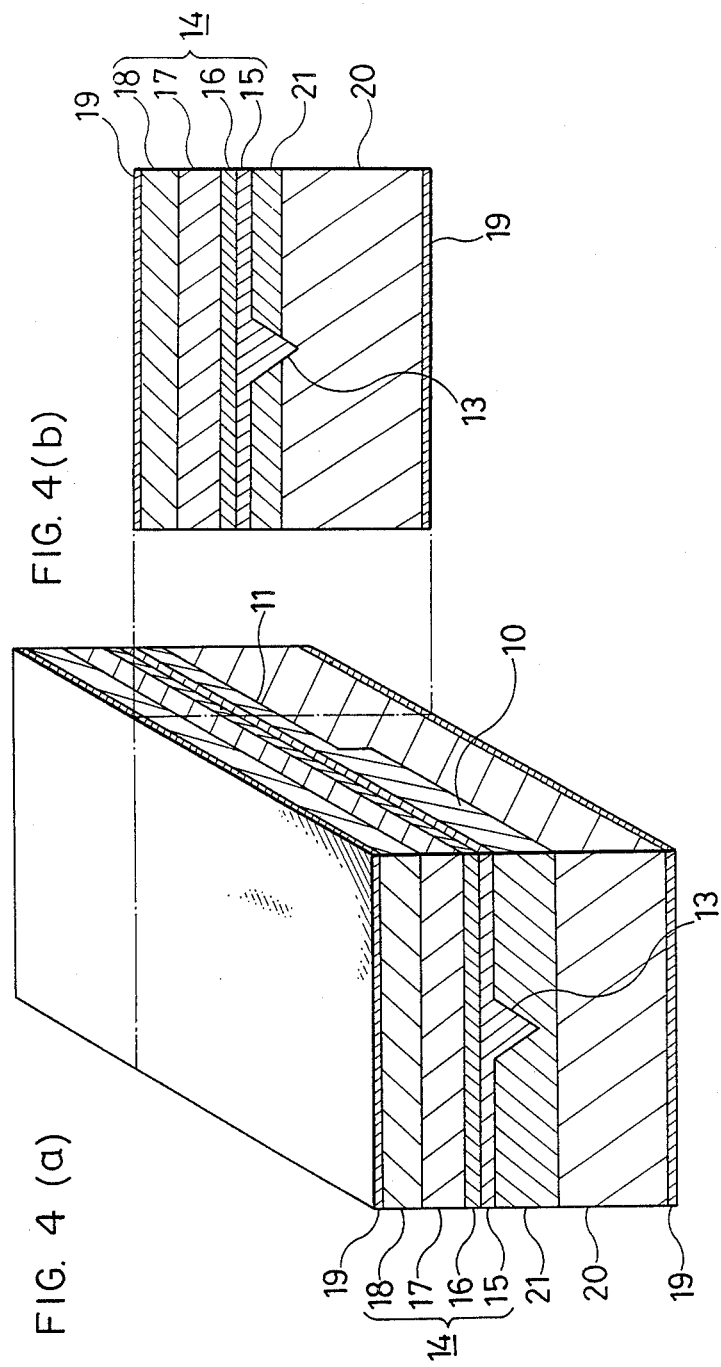

INTERNAL CURRENT CONFINEMENT TYPE SEMICONDUCTOR LIGHT EMISSION DEVICE

FIELD OF THE INVENTION

The present invention relates to a semiconductor light emission device, and more particularly to a device having an internal stripe structure in which a non-current injected region is easily obtained.

BACKGROUND OF THE INVENTION

FIG. 1 is a cross-sectional view showing a prior art semiconductor light emission device having an internal stripe structure shown in, for example, Japanese Laid Open Patent Publication No. Sho. 57-172789. In FIG. 1, the reference numeral 1 designates a p type GaAs substrate, the numeral 2 designates an n type GaAs current blocking layer deposited on the substrate 1. The numeral 3 designates a p type AlGaAs lower clad layer deposited on the current blocking layer 2. The numeral 4 designates a p type AlGaAs active layer deposited on the lower clad layer 3. The numeral 5 designates an n type AlGaAs upper clad layer deposited on the active layer 4. The numeral 6 designates an n type GaAs contact layer deposited on the upper clad layer 5. The numeral 7 designates a V-shaped groove, and the numeral 8 designates a metal electrode.

The device is operated as follows.

When a voltage is applied to the p-n junction provided at the boundary of the active layer 4 and the upper clad layer 5 in a forward direction through both electrodes 8, a forward direction current confined by the V-shaped groove 7 is injected into the active layer 4 to generate a light emission. The light is guided by the waveguide made by the difference in the diffraction ratio between the active layer 4 and the clad layers 3 and 5, and the difference in the effective diffraction ratio caused by the V-shaped groove 7, and there arises a laser oscillation by the resonator constituted between both cleavage planes.

In this prior art semiconductor light emission device under such a construction, non-light emission carrier recombinations occur which depend on the surface levels of the cleavage planes, and the resonator end surfaces are oxidized by the heat of the recombination, thereby resulting in a gradual degradation in the device characteristics.

SUMMARY OF THE INVENTION

An object of the present invention is to provide a semiconductor light emission device having improved device characteristics without gradual degradation as in prior art devices.

Other objects and advantages of the present invention will become apparent from the detailed description given hereinafter. It should be understood, however, that the detailed description and specific embodiment are given by way of illustration only, since various changes and modifications within the spirit and scope of the invention will become apparent to those skilled in the art from this detailed description.

According to the present invention, a hollow section is provided on the upper surface of a first conductivity type semiconductor substrate which includes a a pair of resonator end surfaces, the hollow section being arranged in a direction vertical to the direction in which the resonator end surfaces confront each other. A second conductivity type current blocking layer having a flat upper surface is provided on the entire upper surface of the semiconductor substrate, and a first conductivity type lower clad layer, a first conductivity type active layer, a second conductivity type upper clad layer are provided one atop another on the entire surface of the current blocking layer. A stripe groove is provided so as to extend in a direction in which the resonator end surfaces confront each other in such a manner that the groove extends only within the current blocking layer at the hollow section and reaches the semiconductor substrate through the current blocking layer except at portions of the hollow section. Such a construction restricts the active region of the active layer, thereby enhancing the device characteristics.

BRIEF DESCRIPTION OF THE DRAWINGS

FIGS. 3(a) to 3(f) are diagrams showing a process of manufacturing the semiconductor light emission device of FIGS. 2(a) and 2(b), wherein FIGS. 3(a), 3(b), 3(c) and 3(f) are side views, and FIGS. 3(d) and 3(e) are cross-sectional views in lines $D_1$-$D_2$, $E_1$-$E_2$ of FIG. 3(c), respectively;

FIGS. 4(a) and 4(b) are a perspective view and a cross-sectional view of the dotted line section of FIG. 4(a), respectively, of a second embodiment of the present invention.

DETAILED DESCRIPTION OF THE PREFERRED EMBODIMENTS

Figure 1:
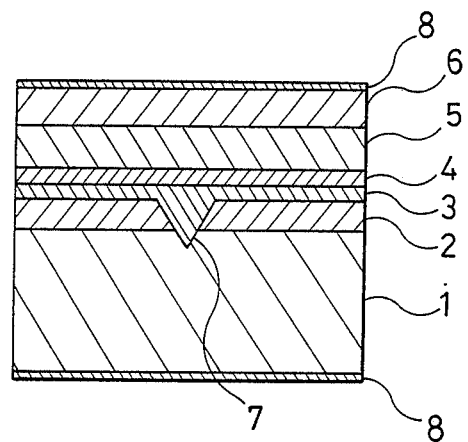
FIG. 1 is a cross-sectional view showing a prior art semiconductor light emission device.
Figures 2A, 2B:
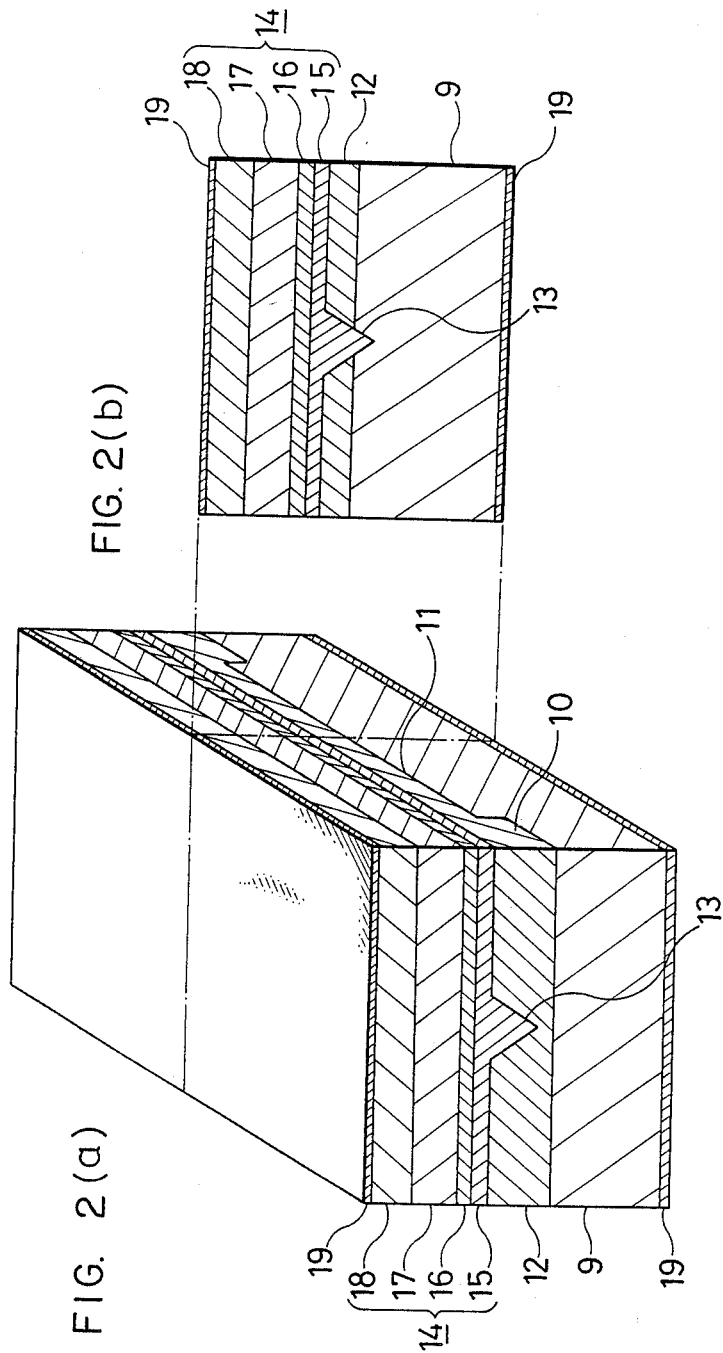
FIGS. 2(a) and 2(b) are a perspective view and a cross-sectional view of an embodiment of the present invention, respectively.

In order to explain the present invention in detail, reference will be particularly made to FIGS. 2(a), 2(b) and 3(a)-3(f):

FIG. 2(a) shows a semiconductor light emission device as an embodiment of the present invention, and FIG. 2(b) is a cross-sectional view thereof. FIGS. 3(a)-3(f) shows a process of manufacturing the device of FIGS. 2(a) and 2(b).

In FIGS. 2(a), 2(b) and 3(a)-3(f), the reference numeral 9 designates a p type GaAs semiconductor substrate having a pair of resonator end surfaces comprising side walls confronting each other. Two hollow sections 10 are provided on the upper surface of the semiconductor substrate 9, each arranged in a direction vertical to the direction in which the resonator end surfaces confront each other, each hollow section including each of the resonator end surfaces. The reference numeral 12 designates an n type GaAs current blocking layer having an upper flat surface provided on the entire upper surface of the semiconductor substrate 9. The numeral 13 designates a stripe groove extending in a direction in which the resonator end surfaces confront each other such that the groove extends only within the current blocking layer 12 at the hollow sections 10 and the groove reaches the semiconductor substrate 9 through the current blocking layer 12 except at portions of the hollow sections 10, such as at portion 11. The numeral 14 designates a multi-layer semiconductor laser operation region having a heterojunction structure provided on the entire upper surface of the current blocking layer 12 so as to embed the groove 13. This multi-layer semiconductor laser operation region 14 comprises a p type AlGaAs lower clad layer 15 provided on the entire upper surface of the current blocking layer 12 so as to embed the groove 13, a p type AlGaAs active layer 16 provided on the entire upper surface of the lower clad layer 15, an n type AlGaAs upper clad layer 17 provided on the entire upper surface of the active layer 16, and an n type GaAs contact layer 18 provided on the entire upper surface of the upper clad layer 17. The numeral 19 designates metal electrodes provided on the upper surface of the multi-layer semiconductor layer laser operation region 14 and on the lower surface of the semiconductor substrate 9.

With reference to FIGS. 3(a)-3(f), the process of producing the above described embodiment is described below.

Figure 3:
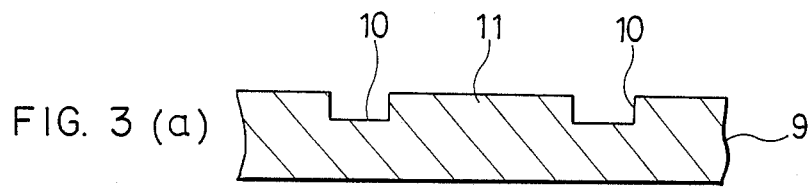
Figure 3:
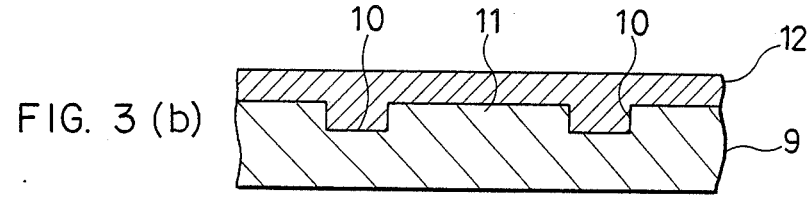
Figure 3:
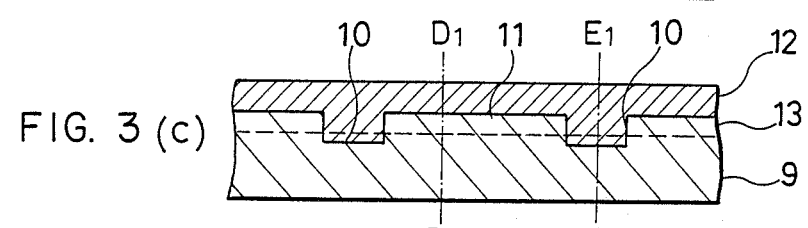

(1) A hollow section 10 is produced on the upper surface of the semiconductor substrate 9 by selective etching using photolithography (refer to FIG. 3(a)).

(2) An n type GaAs current blocking layer 12 is then produced on the semiconductor substrate 9 by liquid phase epitaxy so as to embed the hollow section 10 (refer to FIG. 3(b)).

Figures 3, 3E:
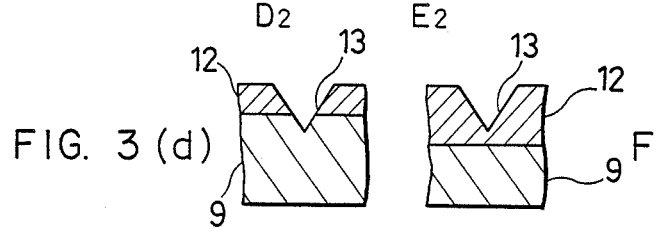

(3) Next, a V-shaped groove 13 is produced by selective etching using photolithography. Then, the V-shaped groove 13 is produced in such a manner that it does not reach the substrate 9 as shown in FIG. 3(e) at the hollow section 10 (refer to line $E_1$-$E_2$ of FIG. 3(c)), and does reach the substrate 9 as shown in FIG. 3(d) at section 11 other outside the hollow section 10 (refer to line $D_1$-$D_2$ of FIG. 3(c)).

Figure 3F:
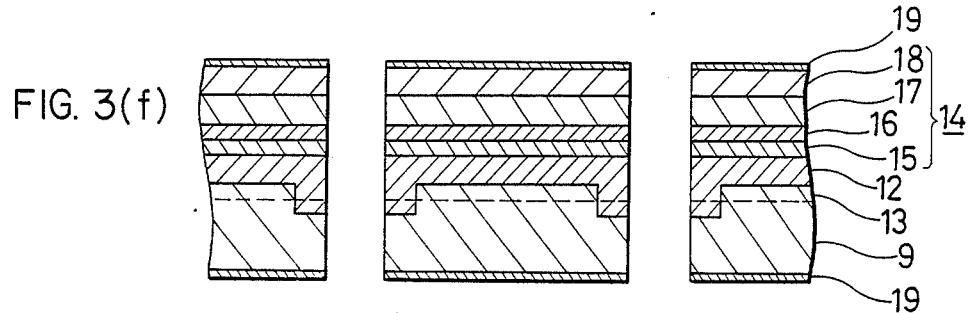

(4) Subsequently, the various layers from the p type AlGaAs lower clad layer 15 to the n type GaAs contact layer 18 are grown by liquid phase epitaxy, and then the electrodes 19 are produced, and finally a semiconductor laser is obtained by conducting a cleavage of the chip (refer to FIG. 3(f)).

The operation and the effect of the device is described below.

The mechanism of laser oscillation is the same as that of the prior art device described above. The forward direction current flows only through the internal current path made by the V-shaped groove 13 because the V-shaped groove 13 is provided on the current blocking layer 12 so as not to reach the semiconductor substrate 9 at the hollow sections 10. Accordingly, the regions of both end surfaces of the active layer 16 become non-carrier injected regions, and the oxidation of each end surface is prevented. Thus, the device characteristics are maintained regardless that energy is generated by non-light emission carrier recombinations which occur dependent on the surface levels.

In the illustrated embodiment a p type GaAs substrate is used, but the conductivity type thereof can be inverted to n.

In the illustrated embodiment AlGaAs is used as a material for the active layer 16 and the clad layers 15 and 17, but InGaAsP, (AlGa)InP, or the like can be used as a material for those with the same effects.

In the illustrated embodiment non-carrier injected regions are provided in the neighborhood of both end surfaces so as to prevent end surface deterioration caused by the carrier recombinations, but devices having different functions can be constituted by positively introducing non-carrier injected regions by providing hollow sections on a half of the substrate as shown in FIGS. 4(a) and 4(b).

Figure 5:
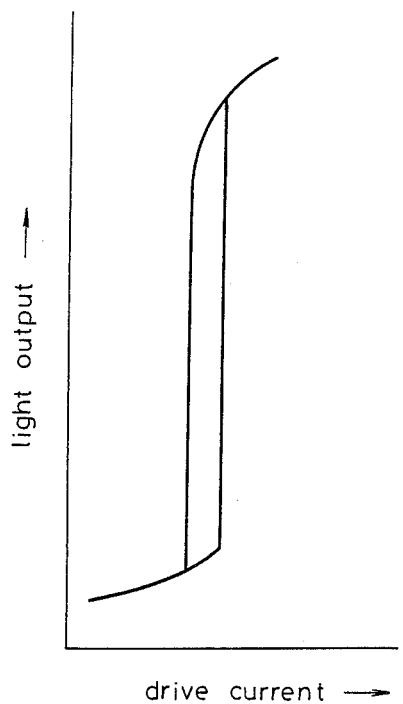
FIG. 5 is a diagram showing a light output vs current characteristics of the semiconductor light emission device of FIGS. 4(a) and 4(b).

FIGS. 4(a) and 4(b) show another embodiment of the present invention having such a construction, and this is a non-uniform excitation semiconductor light emission device which functions as a saturable absorption type optical bistable device. The reference numeral 20 designates a p types GaAs semiconductor substrate having a hollow section at the central portion of the chip. The numeral 21 designates an n type GaAs current blocking layer which is grown on the semiconductor substrate 20 by liquid phase epitaxy. This embodiment uses the same operation mechanism as that of the first embodiment described above, and the active layer 16 on the hollow section 10 becomes a non-carrier injected region. This non-carrier injected region becomes a light absorption region, and the absorption coefficient is as small as the light intensity in the laser oscillator is large, showing saturable absorption characteristics. This saturable absorption material is located in the Fabry-Perot resonator constituted by the cleavage surfaces, thereby generating a saturable absorption type light bistable element. That is, when the intensity of light emission at the carrier injected region is small, the absorption at the non-carrier injected region is large, whereby the output light is a low level. However, when the intensity of light emission increases to a predetermined value, the absorption at the non-carrier injected region is saturated, whereby a small amount of light transpares that region, and a complete saturation of absorption occurs suddenly accompanied with a Fabry-Perot resonation, thereby outputting a high level output. On the other hand, when the intensity of light emission decreases and comes close to a predetermined level, a process contrary to that described above occurs. In this way, a hysteric characteristics and a bistability in the light output are obtained as shown in FIG. 5. This semiconductor light emission device having such a bistable output is applicable to a light switching element, a light memory device, or the like.

As is evident from the foregoing description, according to the present invention, a hollow section is provided on a semiconductor substrate so that the current blocking layer is separated into two portions is opened and where a current path closed, whereby a current blocking is conducted in the neighborhood of the active layer, and a non-carrier injected region is provided easily and with high precision. Furthermore, when a non-carrier injected region is provided at the neighborhood of the laser end surface, the oxidization of the end surface and the deterioration of the device characteristics caused by non-light emission carrier recombinations can be reduced, and when a non-carrier injected region is provided at the central portion of the chip, an absorption saturation type light bistable element is obtained.

What is claimed is:

1. A semiconductor light emission device including a laser operation area which comprising:
   a first conductivity type semiconductor substrate including two resonator end surfaces disposed on opposite sides thereof, wherein at least one hollow section is formed in said substrate in a direction perpendicular to the plane of an upper surface of said substrate between said resonator end surfaces;
   a second conductivity type current blocking layer having a flat upper surface formed on the entire upper surface of said substrate;
   a stripe groove formed in said current blocking layer in a direction perpendicular to said resonator end surfaces, said stripe groove extending only within said current blocking layer at said hollow section and extending to said substrate through said current blocking layer outside said hollow section;

a first conductivity type lower clad layer formed on the entire upper surface of said current blocking layer so as to embed said stripe groove;

a first or second conductivity type active layer formed on the entire upper surface of said lower clad layer; and a second conductivity type upper clad layer formed on the entire upper surface of said active layer.

2. The semiconductor light emission device of claim 1, wherein two hollow sections are formed in said substrate so that each hollow section includes one of said resonator end surfaces.

3. The semiconductor light emission device of claim 1, wherein one hollow section is formed in said substrate so as to include only one of said resonator end surfaces.

4. The semiconductor light emission device of claim 1, wherein said first conductivity type semiconductor substrate comprises a material selected from the group consisting of GaAs and InP, and said second conductivity type semiconductor laser comprises a material selected from the group consisting of GaAs, AlGaAs, InP, and InGaAsP.

5. The semiconductor light emission device of claim 4, wherein said device further comprises a contact layer formed on said upper clad layer, and electrodes formed on said contact layer and on said substrate.

6. The semiconductor light emission device of claim 5, wherein said stripe groove is V-shaped and wherein said substrate, said current blocking layer, and said contact layer comprise GaAs, and said lower clad layer, said active layer, and said upper clad layer comprise AlGaAs.

7. The semiconductor light emission device of claim 1, wherein said hollow section is a rectangular-shaped groove forming in said substrate parallel to said resonator end surfaces.

8. The semiconductor light emission device of claim 7, wherein two hollow sections are formed in said substrate so that each hollow section includes one of said resonator end surfaces.

9. The semiconductor light emission device of claim 1, wherein one hollow section is formed in said substrate so as to include only one of said resonator end surfaces.

10. The semiconductor light emission device of claim 7, wherein said first conductivity type semiconductor substrate comprises a material selected from the group consisting of GaAs and InP, and said second conductivity type semiconductor laser comprises a material selected from the group consisting of GaAs, AlGaAs, InP, and InGaAsP.

11. The semiconductor light emission device of claim 10, wherein said device further comprises a contact layer formed on said upper clad layer, and electrodes formed on said contact layer and on said substrate.

12. The semiconductor light emission device of claim 11, wherein said stripe groove is V-shaped and wherein said substrate, said current blocking layer, and said contact layer comprise GaAs, and said lower clad layer, said active layer, and said upper clad layer comprise AlGaAs.

* * * * *